United States Patent
Jeannin et al.

(10) Patent No.: US 12,446,375 B2
(45) Date of Patent: Oct. 14, 2025

(54) DISPLAY PIXEL COMPRISING LIGHT-EMITTING DIODES FOR A DISPLAY SCREEN

(71) Applicant: Aledia, Echirolles (FR)

(72) Inventors: Olivier Jeannin, Grenoble (FR); Ivan-Christophe Robin, Grenoble (FR); Frédéric Mercier, Coublevie (FR)

(73) Assignee: Aledia, Echirolles (FR)

( * ) Notice: Subject to any disclaimer, the term of this patent is extended or adjusted under 35 U.S.C. 154(b) by 0 days.

(21) Appl. No.: 18/712,686

(22) PCT Filed: Nov. 8, 2022

(86) PCT No.: PCT/EP2022/081143
§ 371 (c)(1),
(2) Date: May 22, 2024

(87) PCT Pub. No.: WO2023/094142
PCT Pub. Date: Jun. 1, 2023

(65) Prior Publication Data
US 2024/0421271 A1    Dec. 19, 2024

(30) Foreign Application Priority Data

Nov. 26, 2021    (FR) ........................................ 2112579
Nov. 26, 2021    (FR) ........................................ 2112580

(51) Int. Cl.
*H10H 20/855*    (2025.01)
*H01L 25/075*    (2006.01)
(Continued)

(52) U.S. Cl.
CPC ....... *H10H 20/855* (2025.01); *H01L 25/0753* (2013.01); *H10H 20/018* (2025.01);
(Continued)

(58) Field of Classification Search
CPC ............... H10H 20/855; H10H 20/018; H10H 20/8512; H10H 20/857; H10H 29/142;
(Continued)

(56) References Cited

U.S. PATENT DOCUMENTS

| 2004/0080938 A1 | 4/2004 | Holman et al. |
| 2015/0129908 A1* | 5/2015 | Kobayakawa ....... H10H 20/856 257/89 |

(Continued)

FOREIGN PATENT DOCUMENTS

| CN | 112349707 A | 2/2021 |
| EP | 3 690 944 A1 | 8/2020 |
| WO | WO 2019/236325 A1 | 12/2019 |

OTHER PUBLICATIONS

Written Opinion for International Application No. PCT/EP2022/081143, mailed Dec. 15, 2022.
(Continued)

*Primary Examiner* — Ratisha Mehta
(74) *Attorney, Agent, or Firm* — Wolf, Greenfield & Sacks, P.C.

(57) ABSTRACT

A display block including an optoelectronic circuit including-light-emitting diodes of at least two display pixels and having a first surface of emission of the light radiations of the light-emitting diodes; and diffusing structures covering the optoelectronic circuit, each diffusing structure being in contact with a portion of the first emission surface and having a second surface of emission of the light radiations of the light-emitting diodes of one of the display pixels, the ratio of the sum of the areas of the second emission surfaces to the area of the first emission surface being greater than 2.

21 Claims, 10 Drawing Sheets

(51) Int. Cl.
- *H10H 20/01* (2025.01)
- *H10H 20/851* (2025.01)
- *H10H 20/857* (2025.01)
- *H10H 29/14* (2025.01)

(52) U.S. Cl.
CPC ...... *H10H 20/8512* (2025.01); *H10H 20/857* (2025.01); *H10H 29/142* (2025.01); *H10H 20/0363* (2025.01)

(58) Field of Classification Search
CPC .. H10H 20/0363; H10H 29/34; H10H 29/882; H10H 29/855; H01L 25/0753
See application file for complete search history.

(56) References Cited

U.S. PATENT DOCUMENTS

| | | | | |
|---|---|---|---|---|
| 2016/0141469 A1* | 5/2016 | Robin | ................ | H10H 20/8512 438/29 |
| 2018/0211942 A1* | 7/2018 | Hung | ................ | H10H 20/8514 |
| 2019/0041701 A1* | 2/2019 | Chen | ................ | G02F 1/133553 |
| 2020/0161520 A1* | 5/2020 | Hugon | ................ | H10H 20/857 |

OTHER PUBLICATIONS

International Search Report and English translation thereof mailed Dec. 15, 2022 in connection with International Application No. PCT/EP2022/081143.
First Office Action for Chinese Application No. 202280078511.8, dated Jan. 16, 2025.

\* cited by examiner

DISPLAY PIXEL COMPRISING LIGHT-EMITTING DIODES FOR A DISPLAY SCREEN

The present patent application This Application is a national stage filing under 35 U.S.C. § 371 of International Patent Application Serial No. PCT/EP2022/081143, filed Nov. 8, 2022, which claims priority to French patent application FR21/12579, filed Nov. 26, 2021, and French patent application FR21/12580, filed Nov. 26, 2021. The contents of these applications are incorporated herein by reference in their entirety.

TECHNICAL BACKGROUND

The present disclosure generally concerns display pixels comprising light-emitting diodes for a display screen.

PRIOR ART

A pixel of an image corresponds to the unit element of the image displayed by a display screen. For the display of color images, a display screen generally comprises, for the display of each pixel of the image, at least three components, also called display sub-pixels, which each emit a light radiation substantially in a single color (for example, red, green, and blue). The superposition of the radiations emitted by the three display sub-pixels provides the observer with the colored sensation corresponding to the pixel of the displayed image. In this case, the assembly formed by the three display sub-pixels used for the display of a pixel of an image is called display pixel of the display screen. Each display sub-pixel may comprise a light source, particularly a light-emitting diode.

The display pixels may be distributed in an array, each display pixel being located at the intersection of a row (or line) and of a column of the array. Generally, each row of display pixels is successively selected, and the display pixels of the selected row are programmed to display the desired image pixels.

An active array is a screen drive architecture enabling to maintain all the pixel rows active for the entire duration of an image, conversely to arrays called passive, where each row is only active for a time T=Tframe/N (where Tframe is the duration of the image and N is the number of rows of the screen). This enables to optimize the operation of the light-emitting diodes. Further, it is possible to send low voltage or current levels on the array control lines, which enables to display larger data flows.

In the context of a screen based on light-emitting diodes of micrometer-range dimensions, the size of the light-emitting diodes is generally smaller than the surface area available on the screen for the image pixel due to the high intrinsic luminosity of light-emitting diodes. A method of manufacturing a display screen comprises depositing these unit light-emitting diodes on a support, also called slab, containing drive electronics. Another manufacturing method comprises using display pixels comprising light-emitting diodes and a circuit for controlling these light-emitting diodes. It is then spoken of smart pixels. This particularly enables to simplify the forming of an active array, since the control electronics of the light-emitting diodes of the display pixel is for the most part embedded in the display pixel. Document WO 2018/185433 describes an example of a smart pixel.

There is a trend towards the increase of the number of display pixels of the screen. This causes an increase of the cost and of the duration of the manufacturing of the display screen, which particularly depends on the number of operations for installing the display pixels on the slab, which is not desirable.

It is desirable for the dimensions of the display pixels to be as small as possible to decrease the quantity of semiconductor materials forming the display pixels and thus decrease the manufacturing costs of these display pixels. However, the bonding of display pixels of small dimensions to the slab may then be difficult, in particular to ensure a proper electric connection between conductive pads of the display pixels and conductive tracks of the slab. This problem is all the more critical regarding the current trend towards the increase of the number of display pixels of the screen.

SUMMARY OF THE INVENTION

An object of an embodiment is to provide a the display pixel comprising light-emitting diodes for a display screen overcoming all or part of the disadvantages of existing display pixels comprising light-emitting diodes.

An object of an embodiment is for the number of operations for installing the display pixels on the slab of the display screen to be decreased.

An object of an embodiment is for the accuracy constraints for the connection of the display pixels to a slab to be decreased.

An embodiment provides a display block comprising:
an optoelectronic circuit comprising light-emitting diodes of at least two display pixels and having a first surface of emission of the light radiations of the light-emitting diodes; and
diffusing structures covering the optoelectronic circuit, each diffusing structure being in contact with a portion of the first emission surface and having a second surface of emission of the light radiations of the light-emitting diodes of one of the display pixels, the ratio of the sum of the areas of the second emission surfaces to the area of the first emission surface being greater than 2.

This enables to use display pixels of small dimensions while keeping a significant emission surface area for each display pixel.

According to an embodiment, the display pixels are separated by first separation elements which do not let through the light radiations of the light-emitting diodes and the diffusing structures are separated by second separation elements which do not let through the light radiations of the light-emitting diodes, the first separation elements being aligned with the second separation elements at the level of the first emission surface. It is possible for each diffusing structure to only receive the light radiation of the light-emitting diodes of one of the display pixels. This enables to avoid optical crosstalk between display pixels of a same display block.

Each diffusing structure aims at distributing the light radiations emitted by the light-emitting diodes of the display pixel in contact with this diffusing structure over the entire second emission surface associated with the diffusing structure. According to an embodiment, the second emission surface is a diffusing surface. According to an embodiment, each diffusing structure is at least partly made of a diffusing material. According to an embodiment, each diffusing structure is at least partly formed of a waveguide. According to an embodiment, each diffusing structure comprises patterns distributed on a surface and reflecting or diffusing the light radiations. According to an embodiment, the surface density of the patterns increases away from the optoelectronic circuit.

According to an embodiment, the display block comprises an electrically-insulating sheath surrounding the optoelectronic circuit, the diffusing structures covering the sheath, in contact with the sheath or separated from the sheath by an air film via spacers interposed between the sheath and the diffusing structures.

According to an embodiment, the optoelectronic circuit comprises a third surface opposite to the first surface and first electrically-conductive pads exposed on the third surface, the display block comprising electrically-conductive tracks in contact with the first electrically-conductive pads and continued by second electrically-conductive pads extending on the sheath.

An embodiment provides a display block comprising:
 an optoelectronic circuit comprising light-emitting diodes of at least one display pixel, a first surface of emission of the light radiations of the light-emitting diodes, a third surface opposite to the first surface, and first electrically-conductive pads exposed on the third surface;
 an electrically-insulating sheath surrounding the optoelectronic circuit; and
 electrically-conductive tracks in contact with the first electrically-conductive pads and continued by second electrically-conductive pads extending on the sheath.

The interval between the second conductive pads may be increased with respect to the interval between the first conductive pads. This cases the subsequent laying of the pixel blocks on a slab, by decreasing the constraints relative to the accuracy of the positioning of the pixel blocks at the time of the transfer onto the slab.

According to an embodiment, at least one of the diffusing structures contains luminophores. According to an embodiment, the luminophores comprise quantum dots. According to an embodiment, at least two diffusing structures contain different luminophores. According to an embodiment, the light-emitting diodes each emit a first light radiation at a first wavelength, and the diffusing structures comprise a first diffusing structure comprising first luminophores adapted to converting the first light radiation into a second light radiation at a second wavelength different form the first wavelength and a second diffusing structure comprising second luminophores adapted to converting the first light radiation into a third light radiation at a third wavelength different from the first wavelength and from the second wavelength.

According to an embodiment, the display pixels of the optoelectronic circuit are contiguous and the first emission surface is centered with respect to the surface formed by the second emission surfaces. According to an embodiment, the optoelectronic circuit comprises four display pixels.

According to an embodiment, the optoelectronic circuit comprises a single circuit for controlling all the light-emitting diodes of the display pixels. The optoelectronic circuit thus comprises the light-emitting diodes associated with a plurality of display pixels which are controlled by the same control circuit. This advantageously enables to decrease the number of conductive pads necessary for the power supply/the control of these display pixels. This cases the subsequent laying of the pixel blocks on a slab, by decreasing the constraints relative to the accuracy of the positioning of the pixel blocks at the time of the transfer onto the slab.

An embodiment also provides a display screen comprising a slab and a plurality of display blocks, such as previously defined, bonded to the slab.

According to an embodiment, the display pixels of the display blocks are arranged in rows and in columns, and the optoelectronic circuit of each display block comprises at least four display pixels belonging to at least two adjacent rows and to at least two adjacent columns.

An embodiment also provides a method of manufacturing display blocks such as previously defined, comprising the following steps:
 a) forming of a wafer comprising a plurality of said optoelectronic circuits;
 b) cutting of the wafer to separate said optoelectronic circuits; and
 c) for each separate optoelectronic circuit, forming of the diffusing structures covering the optoelectronic circuit.

According to an embodiment, the method further comprises, at step a), the forming of first separation elements in each optoelectronic circuit separating the display pixels, and, at step c), the forming of second separation elements separating the diffusing structures and aligned with the first separation elements.

An embodiment also provides a method of manufacturing a display screen such as previously defined comprising the installing of the display blocks on the slab. The small number of first conductive pads per display pixel, and the forming of the second conductive pads enables to increase the interval between the second conductive pads. This cases the subsequent laying of the display blocks on a slab, by decreasing the constraints relative to the accuracy of the positioning of the display blocks at the time of the transfer onto the slab.

According to an embodiment, the sheath entirely surrounds the optoelectronic circuit and the minimum dimension of the sheath in a plane parallel to the third surface is in the range from 5 µm to 5 mm. According to an embodiment, the maximum dimension of the optoelectronic circuit in a plane parallel to the third surface is in the range from 10 µm to 200 µm and the maximum dimension of the display block in said plane parallel to the third surface is in the range from 100 µm to 500 µm. According to an embodiment, the maximum interval between the centers of the first electrically-conductive pads is in the range from 0.5 µm to 2 mm and the minimum interval between the centers of the second electrically-conductive pads is in the range from 1 µm to 5 mm, preferably from 5 µm to 3 mm.

According to an embodiment, the optoelectronic circuit comprises only four first electrically-conductive pads.

An embodiment also provides a method of manufacturing display blocks such as previously defined, comprising the following steps:
 a') forming of a wafer comprising a plurality of said optoelectronic circuits;
 b') cutting of the wafer to separate said optoelectronic circuits; and
 c') for each separated optoelectronic circuit, forming of the electrically-insulating sheath surrounding the optoelectronic circuit; and
 d') for each separated optoelectronic circuit, forming of the electrically-conductive tracks in contact with the first electrically-conductive pads and continued by the second electrically-conductive pads extending on the sheath.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties. For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements. Further, it is here considered that the terms "insulating" and "conductive" respectively signify "electrically insulating" and "electrically conductive".

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred, unless specified otherwise, to the orientation of the drawings or to a display screen in a normal position of use.

Unless specified otherwise, the expressions "around", "approximately", "substantially" and "in the order of" signify plus or minus 10%, and preferably plus or minus 5%.

In the following description, the inner transmittance of a layer corresponds to the ratio of the intensity of the radiation coming out of the layer to the intensity of the radiation entering the layer. The absorption of the layer is equal to the difference between number 1 (which corresponds to a perfect transmittance for which the entire incident light is transmitted) and the inner transmittance. In the following description, a layer is said to be transparent to a radiation when the absorption of the radiation through the layer is smaller than 75%. In the following description, a layer is called absorbing or opaque to a radiation when the absorption of the radiation in the layer is greater than 75%. In the rest of the disclosure, the refraction index of a material corresponds to the refraction index of the material for the wavelength range of the radiation emitted by the light source. Unless specified otherwise, the refraction index is considered as substantially constant over the wavelength range of the radiation emitted by the light source, for example, equal to the average of the refraction index over the wavelength range of the radiation emitted by the light source.

Figure 1:
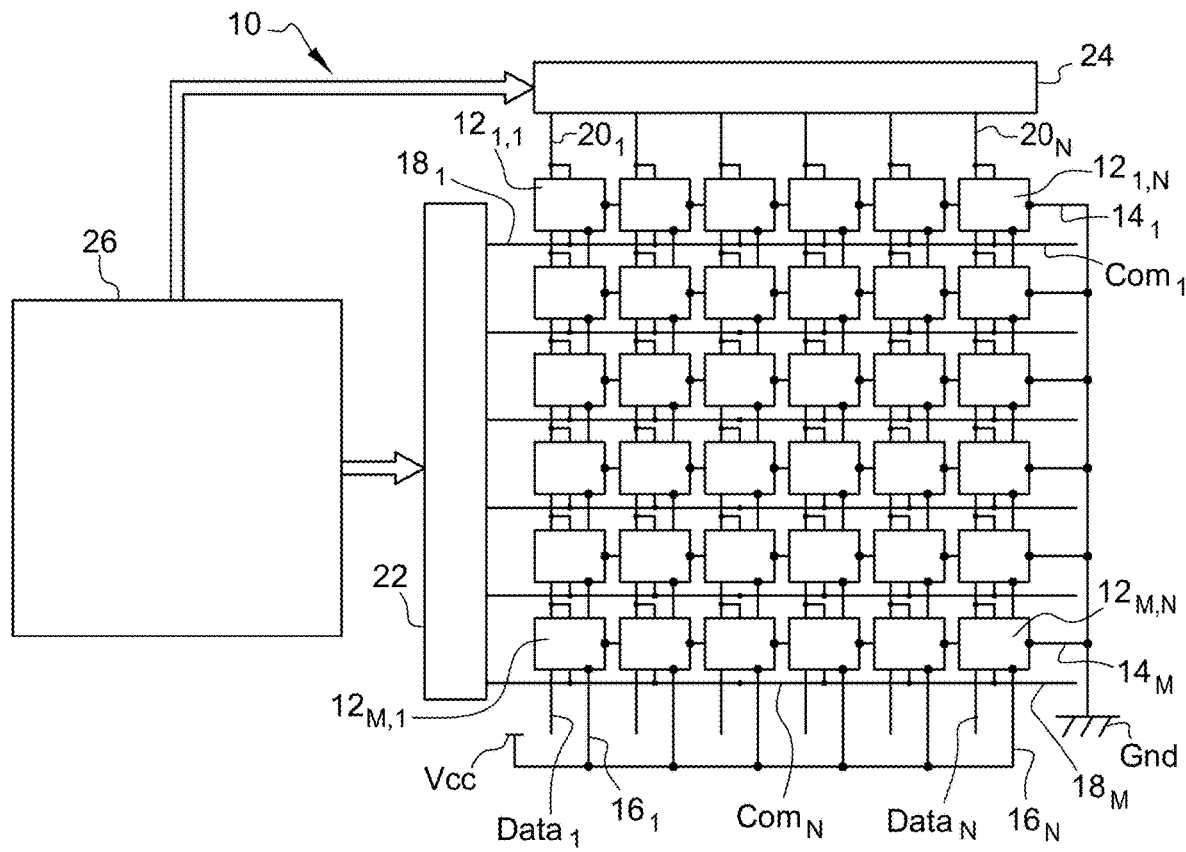
FIG. 1 partially and schematically shows an example of a display screen.

FIG. 1 partially and schematically shows an example of a display screen 10. Display screen 10 comprises display pixels $12_{i,j}$, for example, arranged in M rows and in N columns, M being an integer varying from 1 to 8,000 and N being an integer varying from 1 to 16,000, i being an integer varying from 1 to M and j being an integer varying from 1 to N. As an example, in FIG. 1, M and N are equal to 6. Each display pixel $12_{i,j}$ is coupled to a source of a low reference potential Gnd, for example, the ground, via an electrode $14_i$ and to a source of a high reference potential Vcc via an electrode $16_j$. As an example, electrodes $14_i$ are shown as being aligned along the rows in FIG. 1 and electrodes $16_j$ are shown as being aligned along the columns in FIG. 1, the reverse layout being possible. The power supply voltage of the display screen corresponds to the voltage between high reference potential Vcc and low reference potential Gnd.

For each row, the display pixels $12_{i,j}$ in the row are coupled to a row electrode $18_i$. For each column, the display pixels $12_{i,j}$ in the column are coupled to a column electrode $20_j$. Display screen 10 comprises a selection circuit 22 coupled to row electrodes $18_j$ and adapted to delivering a selection and timing signal $Com_i$ on each row electrode $18_i$.

Display screen 10 comprises a data delivery circuit 24 coupled to column electrodes $20_j$ and adapted to delivering a data signal $Data_j$ on each column electrode $20_j$. Selection circuit 22 and control circuit 24 are controlled by a circuit 23, for example comprising a microprocessor.

When the display pixels correspond to smart pixels, the manufacturing method may comprise the individual installing of each display pixel on a slab. The slab may comprise conductive tracks, each display pixel being bonded to the slab so as to connect contact pads of the display pixel to the conductive tracks. With the trend towards the increase of the resolution of display screens, the number of operations of individual installing of the display pixels may be significant, increasing the display screen manufacturing duration and the cost.

Each display pixel may comprise a control circuit covered with a display circuit. The display circuit comprises at least one light-emitting diode LED, preferably at least three light-emitting diodes LED. The control circuit may correspond to an integrated circuit comprising electronic components, particularly insulated gate field effect transistors, also called MOS transistors, or thin film transistors, also called TFT transistors. The control circuit further comprises the contact pads. A method of manufacturing the display pixel comprises the forming of a plurality of display circuits on a wafer, called optoelectronic wafer, the forming of a plurality of control circuits on a wafer, called logic wafer, the bonding of the optoelectronic wafer to the logic wafer, and the cutting of the stack of the optoelectronic wafer and of the logic wafer to separate the display pixels.

A possibility to decrease the number of operations of installing of display pixels on the slab of the display screen comprises gathering a plurality of display pixels in a group of display pixels integral with one another, each group of pixels for example comprising four display pixels. When the display pixels are manufactured from the stack of an optoelectronic wafer and of a logic wafer as previously described, this amounts to cutting the stack of the optoelectronic wafer and of the logic wafer to separate the groups of pixels instead of individually separating the display pixels. The installing operations are performed on the groups of display pixels instead of the individual pixels. The number of manipulations is thus decreased. Each group of pixels then comprises a stack of a general control circuit integrating the circuits for controlling the display pixels of the group of pixels and a general display circuit comprising the display circuits of the display pixels of the group of pixels.

Figure 2:
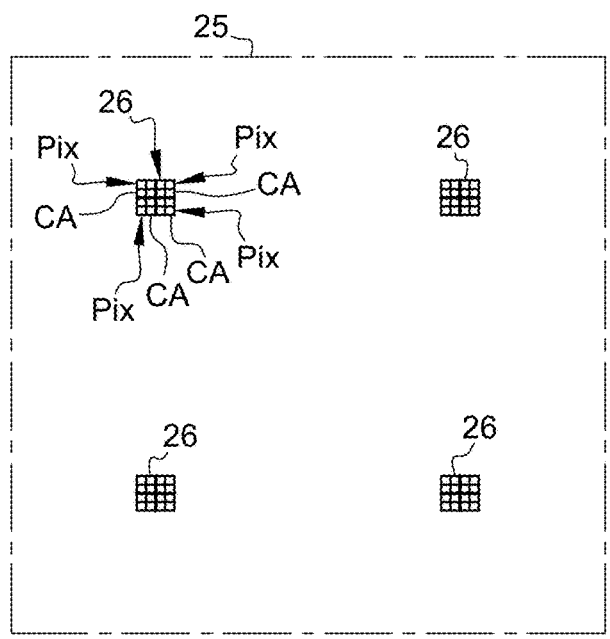
FIG. 2 is a partial simplified top view of an example of arrangement of display pixels of a display screen.
Figure 3:
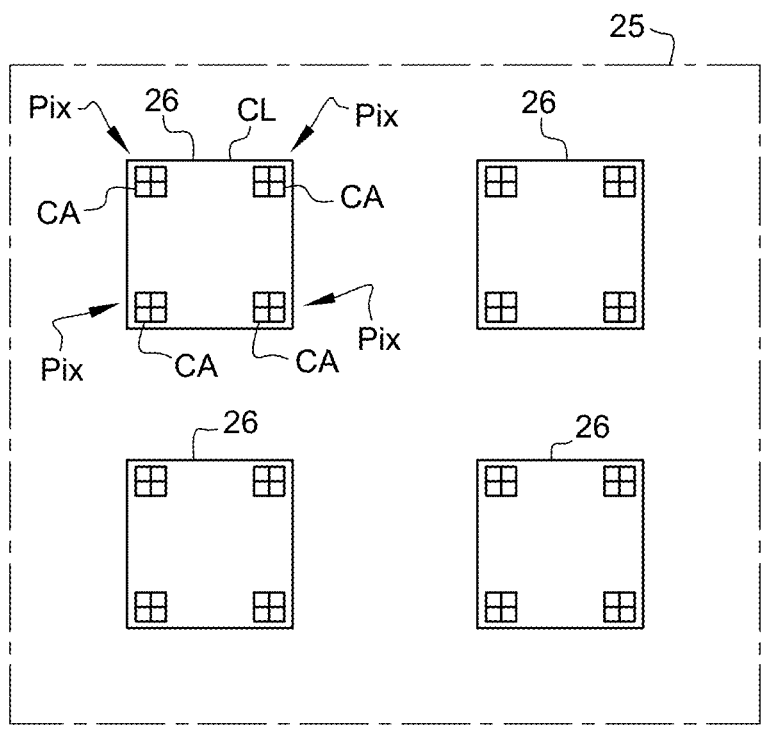
FIG. 3 is a partial simplified top view of another example of arrangement of display pixels of a display screen.

FIGS. 2 and 3 each are a simplified top view of a portion of an example of a display screen 25 comprising groups of pixels 26, four groups of pixels 26 being shown in FIGS. 2 and 3, each group of pixels 26 comprising four display pixels Pix.

In FIG. 2, the light-emitting diodes CA of the display pixels Pix of each group of pixels 26 are contiguous. A disadvantage is that, when the lateral dimensions of the display pixels Pix are decreased, the display pixels Pix of a same group of pixels 26 may not be individually distinguished by an observer who will then perceive a single image pixel.

In FIG. 3, each group of pixels 26 comprises a logic circuit CL, having the light-emitting diodes CA of the display pixels arranged thereon, having sufficiently large lateral dimensions for the light-emitting diodes CA of the display pixels of a same group of pixels 26 not to be contiguous. The display pixels Pix of a same group of pixels 26 may thus be individually distinguished by an observer who will then perceive distinct image pixels. A disadvantage is that a significant portion of the surface area, in top view, of the group of pixels 26 does not take part in the emission of light while it has a cost in terms of manufacturing of the general control circuit and of the general display circuit.

Figure 4:
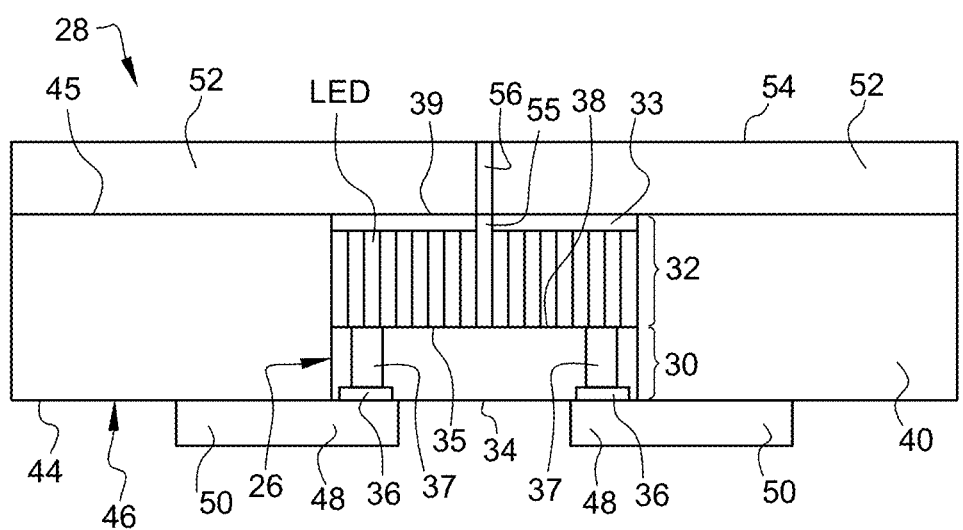
FIG. 4 is a partial simplified lateral cross-section of an embodiment of a group of pixels.
Figure 5:
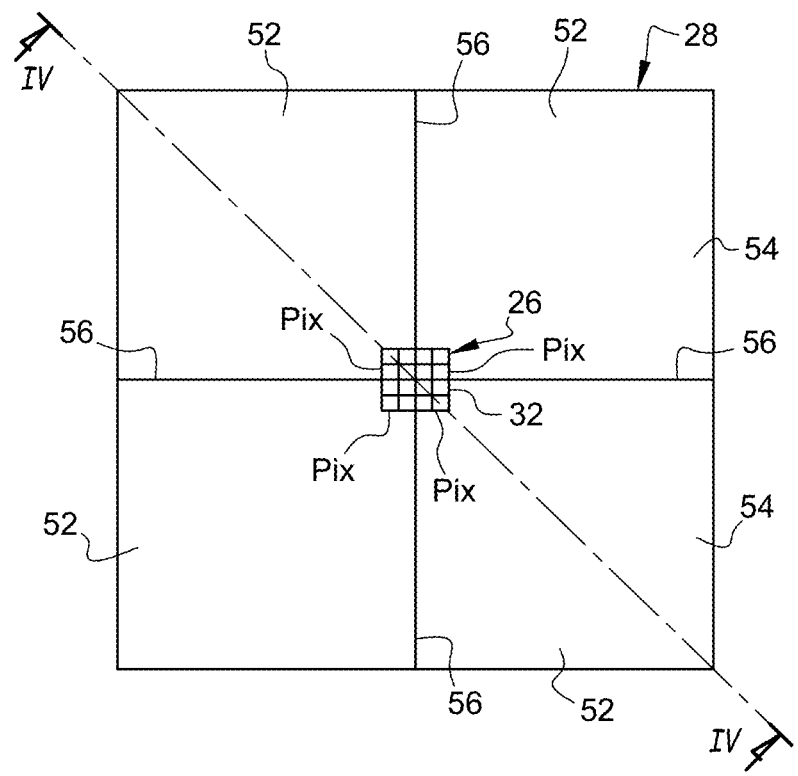
FIG. 5 is a partial simplified top view of the embodiment of the group of pixels of FIG. 4.
Figure 6:
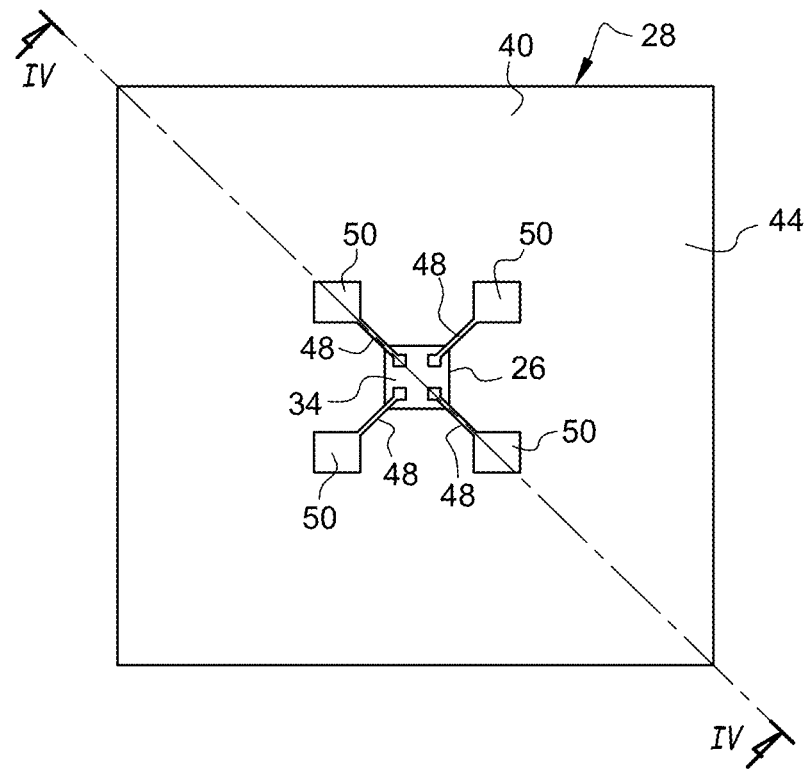
FIG. 6 is a partial simplified bottom view of the embodiment of the group of pixels of FIG. 4.

FIGS. 4, 5, and 6 are partial simplified respective lateral cross-section, top, and bottom views, of an embodiment of a pixel block 28. The cross-section of FIG. 4 is taken along line IV-IV in FIGS. 5 and 6.

Block 28 comprises a group 26 of pixels, which comprises at least two display pixels. In FIGS. 4, 5, and 6, the group of pixels 26 comprises four display pixels Pix. The group of pixels 26 comprises a general control circuit 30, which integrates the circuits for controlling display pixels Pix and which is covered with a general display circuit 32 which integrates the display circuits of display pixels Pix. According to an embodiment, the display pixels may be controlled independently from one another. General control circuit 30 is then configured to control the display pixels independently from one another.

General control circuit 30 comprises a lower surface 34 and an upper surface 35 opposite to lower surface 34, surfaces 34 and 35 being preferably parallel. The lower surface 34 of general control circuit 30 forms the lower surface of the group of pixels 26. General control circuit 30 further comprises conductive pads 36 exposed on lower surface 34. General control circuit 30 may comprise a semiconductor substrate, not shown, covered with at least one metallization level, not shown. In particular, generally control circuit 30 may correspond to an integrated circuit comprising electronic components, particularly MOS transistors, or TFT transistors. General control circuit 30 may further comprise through conductive vias 37 extending across a portion of the thickness of general control circuit 30 and enabling to connect conductive pads 36 to other electronic components of the general control circuit or to connect conductive pads 36 directly to general display circuit 32.

General display circuit 32 comprises a lower surface 38 and an upper surface 39 opposite to lower surface 38, surfaces 38 and 39 being preferably parallel. The upper surface 39 of general display circuit 32 forms the upper surface of the group of pixels 26. The lower surface 38 of general display circuit 32 is bonded to the upper surface 35 of general control circuit 30.

General display circuit 32 comprises for each display pixel Pix at least one light-emitting diode LED, preferably at least three light-emitting diodes LED. General display circuit 32 may comprise a monolayer or multilayer structure 33 covering the light-emitting diodes LED and forming upper surface 39. Most of, preferably all of, the radiations emitted by the light-emitting diodes LED of the display pixels is emitted by the upper surface 39 of general display circuit 32. Preferably, general display circuit 32 comprises light-emitting diodes LED only, and the conductive elements of these light-emitting diodes LED, and general control circuit 30 comprises all the electronic components necessary for the control of the light-emitting diodes LED of general display circuit 32. As a variant, general display circuit 32 may also comprise other electronic components in addition to light-emitting diodes LED. Light-emitting diodes LED may be 2D light-emitting diodes, also called planar light-emitting diodes, comprising a stack of planar layers, or 3D light-emitting diodes, each comprising a three-dimensional semiconductor element covered with an active area.

Pixel block 28 further comprises a sheath 40 surrounding the group of pixels 26. Sheath 40 extends all over the lateral surfaces of the group of pixels 26. Sheath 40 comprises a lower surface 44 and an upper surface 45 opposite to lower surface 44, surfaces 44 and 45 being preferably planar and parallel. The lower surface 44 of sheath 40 forms, with the lower surface 34 of the group of pixels 26, a lower surface 46 of pixel block 28, also called contact surface hereafter. Preferably, the lower surface 44 of sheath 40 and the lower surface 34 of the group of pixels 26 are planar and coplanar, so that contact surface 46 is planar. Preferably, the upper surface 45 of sheath 40 and the upper surface 39 of the group of pixels 26 are planar and coplanar. Sheath 40 is preferably made of an insulating material. As an example, sheath 40 is made of silicon oxide ($SiO_2$).

Pixel block 28 comprises conductive tracks 48 and conductive pads 50, four conductive tracks 48 and four conductive pads 50 being shown as an example in FIG. 6. Conductive tracks 48 extend over the lower surface 34 of the group of pixels 26 and over the lower surface 44 of sheath 40 and conductive pads 50 rest on the lower surface 44 of sheath 40. Each track 48 is connected, at an end, to one of conductive pads 50 and is connected, at a first end, to one the conductive pads 36 of the group of pixels 26. Conductive tracks 48 and conductive pads 50 are for example made of aluminum (Al) or of copper (Cu).

Pixel block 28 further comprises diffusing structures 52, the number of diffusing structures 52 being equal to the number of display pixels Pix of pixel group 26. Each diffusing structure 52 receives the radiation emitted by one of display pixels Pix. Each diffusing structure 52 covers a portion of the upper surface 45 of sheath 40 and a portion of the upper surface 39 of the group of pixels 26. The transmission of the radiation of the general display circuit 32 from the group of pixels 26 to diffusing structures 52 particularly occurs through the upper surface 39 of the group of pixels 26 in contact with diffusing structures 52. Each diffusing structure 52 comprises an upper surface 54 for the emission of the radiation emitted by one of display pixels Pix.

Pixel block 28 comprises first separation elements 55 present in general display circuit 32 and separating display pixels Pix, and second separation elements 56 separating diffusing structures 52. First and second separation elements 55, 56 do not let through the radiation emitted by light-emitting diodes LED. First separation elements 55 are aligned with second separation elements 56. First separation elements 55 for example extend over most of, preferably over at least 75% of, more preferably over all of, the thickness of monolayer or multilayer structure 33 and of the light-emitting diodes LED all the way to general control circuit 30. Second separation elements 56 may correspond to trenches filled with air extending across the entire thickness of diffusing structures 52, or walls reflecting the radiation emitted by the display pixels. These separation elements 55, 56 thus enable to avoid for the light emitted by a display pixel Pix to diffuse on the adjacent display pixel, which would modify its emission spectrum and intensity, and would adversely affect the sharpness of the displayed image. According to an embodiment, all the lateral walls of each diffusing structure 52 do not let through the radiation emitted by light-emitting diodes LED. For this purpose, the outer lateral walls of diffusing structure 52 may be covered with a coating opaque to the radiation emitted by light-emitting diodes LED and/or reflecting the radiation emitted by light-emitting diodes LED and/or an air film. This enables to avoid optical crosstalk between adjacent pixel blocks 28.

For each display pixel Pix, diffusing structure 52 partially fulfills a function of waveguide of the radiation emitted by display pixel Pix so that, in operation, substantially at least 50%, preferably at least 75%, more preferably at least 90%, more preferably still 100%, of surface 54 of diffusing structure 52 emits light. The ratio of the sum of the areas of the emission surfaces 54 of diffusing structures 52 to the area of the upper surface 39 of the group of pixels 26 is greater than 2, preferably greater than 5, preferably greater than 50, more preferably greater than 500.

According to an embodiment, each display pixel comprises first, second, and third display sub-pixels adapted to emitting radiations at first, second, and third wavelengths. According to an embodiment, the first wavelength corresponds to blue light, that is, a radiation having a wavelength in the range from 430 nm to 490 nm. According to an embodiment, the second wavelength corresponds to green light and is within the range from 510 nm to 570 nm. According to an embodiment, the third wavelength corresponds to red light and is within the range from 600 nm to 720 nm.

Sheath 40 may be reflective for the radiation emitted by the display pixels. As an example, sheath 40 may be formed of a material opaque and reflective for the radiation emitted by the display pixels. Sheath 40 may be made of a transparent or diffusing material. In this case, a portion of the radiation emitted by general display circuit 32 may reach diffusing structures 52 through sheath 40. Preferably, separation elements 55 then further comprise third separation elements extending in sheath 40 in line with second separation elements 56. As a variant, a wall reflective for the radiation emitted by the display pixels may be interposed between sheath 40 and the lateral walls of the group of pixels 26 to avoid for part of the radiation emitted by general display circuit 32 to penetrate into sheath 40.

Pixel block 28 may have a generally cylindrical shape with a cross-section that may have different shapes, such as, for example, an oval, circular, or polygonal, particularly triangular, rectangular, square, or hexagonal, shape. As an example, in FIGS. 5 and 6, pixel block 28 is shown with a square cross-section. The group of pixels 26 may have a generally cylindrical shape with a cross-section that may have different shapes, such as, for example, an oval, circular, or polygonal, particularly triangular, rectangular, square, or hexagonal, shape. As an example, in FIGS. 5 and 6, the group of pixels 26 is shown with a square cross-section. The maximum lateral dimension of pixel block 28 in top view may be in the range from 100 µm to 500 µm. The maximum lateral dimension of the group of pixels 26 in top view may be in the range from 10 µm to 200 µm. Sheath 40 may completely surround the group of pixels 26 and the minimum dimension of sheath 40 in the plane of lower surface 34 may be in the range from 5 µm to 5 mm. The thickness of pixel block 28 may be in the range from 20 µm to 750 µm. The thickness of the group of pixels 26 may be in the range from 20 µm to 750 µm. The thickness of sheath 40 measured orthogonally to lower surface 34 may be identical to the thickness of the group of pixels 26. The thickness of general control circuit 30 may be in the range from 10 µm to 725 µm. The thickness of general display circuit 32 may be in the range from 10 µm to 725 µm. In bottom view, the distance between the center of a pad 50 and the center of the group of pixels 26 may be in the range from 50 µm to 300 µm. The thickness of each separation element 56, 55 measured in the top view may be in the range from 2 µm to 3 µm. The maximum interval between the centers of electrically-conductive pads 36 may be in the range from 0.5 µm to 2 mm and the minimum interval between the centers of pads 50 may be in the range from 1 µm to 5 mm, preferably from 5 µm to 3 mm.

Figure 7:
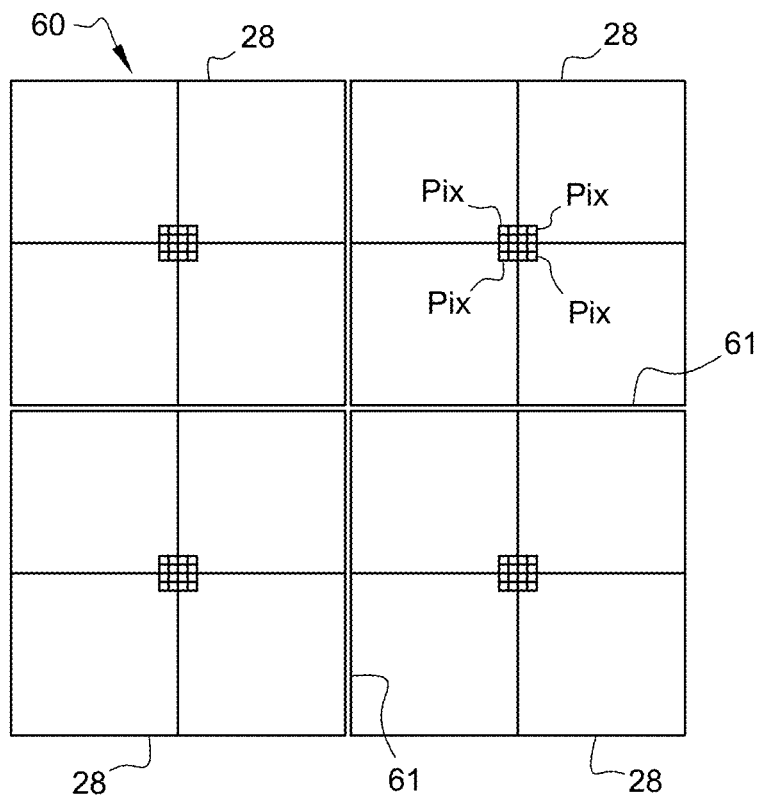
FIG. 7 is a partial simplified top view of an embodiment of a display screen.

FIG. 7 is a simplified top view of a portion of an example of a display screen 60 comprising pixel blocks 28, four pixel blocks 28 being shown in FIG. 7, each pixel block 28 comprising four display pixels Pix. An interstice 61 may be present between two adjacent pixel blocks 28. Interstice 61 may have a thickness in the range from 1 μm to 50 μm. At least 50%, preferably at least 75%, of the surface area of display screen 60 seen by an observer corresponds to emission surface areas of groups of pixels 26. The display pixels Pix of a same group of pixels 26 may be individually distinguished by an observer who will then perceive distinct image pixels. Further, the entire upper surface 39 of the group of pixels 26 takes part in the emission of light.

Each diffusing structure 52 may have a monolayer structure or a multilayer structure. One calls diffusing power of surface 54 at a given location of surface 54 the percentage between the optical power coming out of surface 54 for a unit surface area at said given location and the optical power injected into diffusing structure 52 by general display circuit 32. According to an embodiment, the diffusing power of surface 54 is in the range from 0.5% to 50% at any location of surface 54.

Figure 8:
FIG. 8 is a partial simplified cross-section view illustrating an embodiment of a diffusing structure.

FIG. 8 is a partial simplified cross-section view of an embodiment of diffusing structure 52. According to an embodiment, diffusing structure 52 comprises a texturing on emission surface 54. Diffusing structure 52 may correspond to a layer of a transparent material to which a surface texturing is applied. The texturing may correspond to a polishing. The layer of a transparent material may be made of polymer, of silicone, or of silicon oxide. The thickness of the layer of transparent material may be in the range from 0.01 μm to 100 μm. The arithmetical average height Ra of emission surface 54 is in the range from 0.1 μm to 5 μm.

According to an embodiment, each diffusing structure 52 is a layer of a diffusing material.

Figure 9:
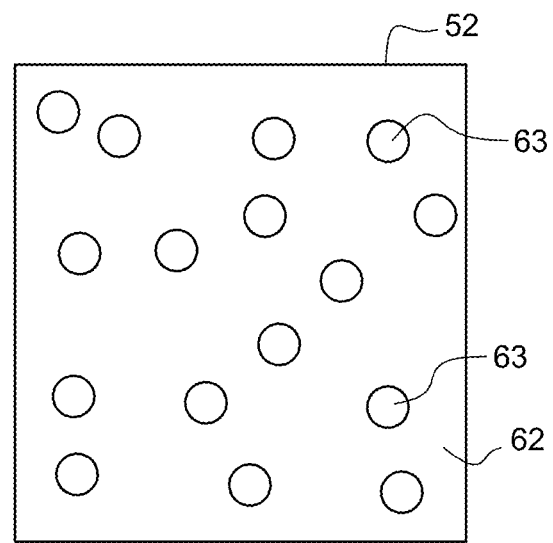
FIG. 9 is a partial simplified cross-section view illustrating another embodiment of a diffusing structure.

FIG. 9 is a simplified view illustrating an example of a diffusing material comprising a matrix 62 having reflective particles 63 dispersed therein. Matrix 62 may be made of a material transparent to the radiations emitted by display pixels Pix. Matrix 62 may comprise silicon oxide ($SiO_2$), a silicone polymer, an epoxide polymer, an acrylic polymer, or a polycarbonate. Particles 63 are for example titanium oxide particles ($TiO_2$). The thickness of the layer made of a diffusing material may be in the range from 2 μm to 2 mm.

Each diffusing structure 52 may at least partly have a waveguide structure. This advantageously enables to guide the radiation emitted by display pixel Pix in the entire diffusing structure 52 so that the emission of the radiation occurs over the entire corresponding emission surface 54.

Figure 10:
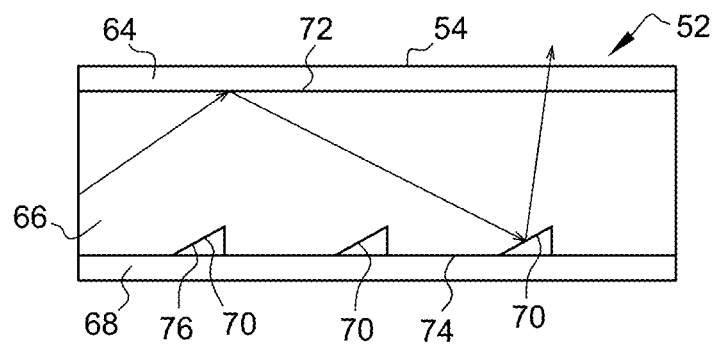
FIG. 10 is a partial simplified cross-section view illustrating another embodiment of a diffusing structure.

FIG. 10 is a partial simplified cross-section view of another embodiment of diffusing structure 52 partly having a waveguide structure and comprising, from top to bottom:
an upper sheath 64 delimiting emission surface 54;
a core 66;
a lower sheath 68, core 66 being sandwiched between lower sheath 68 and upper sheath 64; and
raised patterns 70 of micrometer-range size resting on lower sheath 68 on the side of core 66.

Core 66 may have a monolayer structure or a multilayer structure. In the case where the core has a multilayer structure, all the layers forming core 66 have substantially the same refraction index. Upper sheath 64, lower sheath 68, and patterns 70 may be made of the same material or of different materials. Patterns 70 may be made of the same material as lower sheath 68. In particular, patterns 70 and lower sheath 68 may form a monoblock structure. In particular, patterns 70 and lower sheath 68 may correspond to an air film at least for the portion of diffusing structure 52 facing sheath 40. As a variant, for the portion of diffusing structure 52 facing sheath 40, lower sheath 68 corresponds to an air film and spacers interposed between sheath 40 and core 66 form patterns 70. The refraction index of the material forming core 66 is greater than the refraction index of the material forming upper sheath 64, lower sheath 68, and patterns 70 or, in the case where upper sheath 64, lower sheath 68, and/or patterns 70 are made of different materials, than the refraction indexes of the materials forming upper sheath 64, lower sheath 68, and patterns 70. It is possible for upper sheath 64 not to be present, emission surface 54 then corresponding to the upper surface of core 66. It is possible for lower sheath 68 not to be present between core 66 and sheath 40 and to be replaced with an air film between core 66 and sheath 40, held by spacers interposed between core 66 and sheath 40. The refraction index of lower sheath 68 in contact with the upper surface 39 of the group of pixels 26 is lower than the refraction index of monolayer or multilayer structure 33. Upper sheath 64 comprises a surface 72 in contact with core 66. Preferably, surface 72 is planar and parallel to upper surface 54. Lower sheath 68 comprises a surface 74 having patterns 70 resting thereon and which is, outside of patterns 70, in contact with core 66. Upper sheath 64 may further be used as a protection coating for core 66.

Patterns 70 increase the extraction of the radiation injected into waveguide 52. Patterns 70 may have the same shape or different shapes. As an example, each pattern 70 may comprise a planar surface 76 inclined with respect to upper surface 54. As an example, each pattern 70 may have a prismatic shape. As a variant, patterns 70 may rest on upper sheath 64 on the side of core 66.

According to an embodiment, the thickness of core 66 may be in the range from 2 μm to 1 mm. According to an embodiment, the thickness of upper sheath 64 may be in the range from 1 μm to 150 μm, preferably from 30 μm to 80 μm. According to an embodiment, the thickness of lower sheath 68 may be in the range from 1 μm to 150 μm. The maximum height of each pattern 70, measured with respect to surface 74, may be in the range from 0.5 μm to 100 μm, preferably from 1 μm to 10 μm. Patterns 70 may each have a width smaller than 20 μm, preferably smaller than 12 μm, more preferably between 2 μm and 6 μm.

According to an embodiment, core 66 may be made of polycarbonate (PC), polymethyl methacrylate (PMMA), polyethylene terephthalate (PET), or cyclic olefin polymer (COP). According to an embodiment, upper sheath 64, lower sheath 68, and/or patterns 70 may be made up of an optically clear adhesive (OCA), particularly a liquid optically clear adhesive (LOCA), or of a material with a low refraction index, or an epoxy/acrylate glue, or of a film of a gas or of a gaseous mixture. According to an embodiment, the refraction index of core 66 is in the range from 1.45 to 1.7, and the refraction index of upper sheath 64, of lower sheath 66, and of patterns 70 is in the range from 1 to 1.55. The difference between the refraction index of core 66 and the refraction index of upper sheath 64, of lower sheath 66, and of patterns 70 is greater than 0.07, preferably greater than 0.1. Waveguide 52 may be formed according to a sheet by sheet procedure, or a roll by roll procedure. Patterns 70 may be formed by pressure molding or by inkjet printing.

Figure 11:
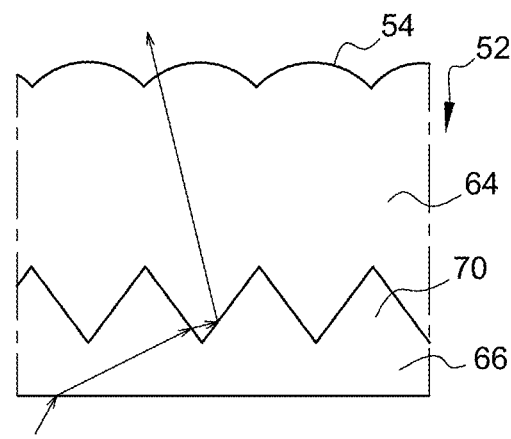
FIG. 11 is a partial simplified cross-section view illustrating another embodiment of a diffusing structure.

FIG. 11 is a partial simplified cross-section view of another embodiment of diffusing structure 52 partly having a structure of the waveguide having a structure similar to that shown in FIG. 10, with the difference that patterns 70 are provided at the interface between core 66 and upper sheath 64. Further, in FIG. 11, emission surface 54 has a texturing improving the diffusion of the emitted light. As an example, the texturing comprises the forming of cavities in upper surface 54 forming lenses of micrometer-range size.

Figure 12:
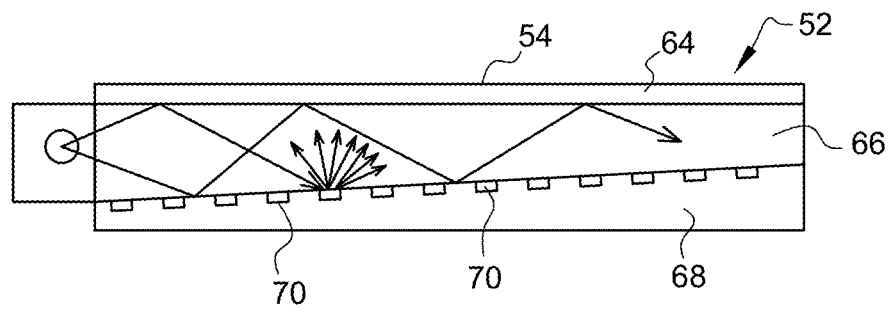
FIG. 12 is a partial simplified cross-section view illustrating another embodiment of a diffusing structure.

FIG. 12 is a partial simplified cross-section view of another embodiment of diffusing structure 52 partly having a waveguide structure having a structure similar to that shown in FIG. 10, with the difference that patterns 70 favor the diffusion of the light guided by the waveguide. As a variant, patterns 70 are not present. In this case, the interface between lower sheath 68 and core 66 is inclined with respect to the interface between upper sheath 64 and core 66 and with respect to emission surface 54.

Figure 13:
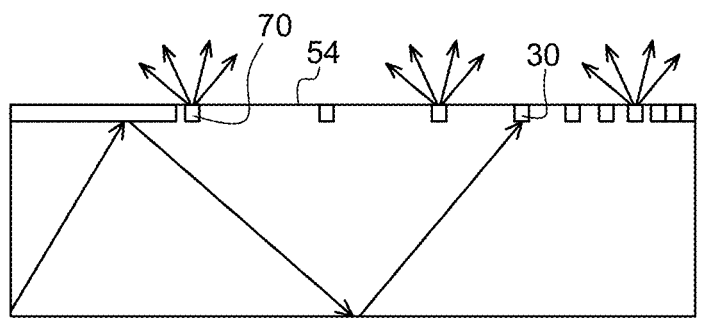
FIG. 13 is a partial simplified cross-section view illustrating another embodiment of a diffusing structure.

FIG. 13 is a partial simplified cross-section view of another embodiment of diffusing structure 52 partly having a structure similar to that shown in FIG. 12, with the difference that patterns 70, which favor the diffusion of the light guided by the waveguide, are located on upper surface 54.

It is possible for the surface density of the patterns 70 of diffusing structure 52 not to be constant. In particular, the surface density of patterns 70 may increase away from to the area of injection of the radiation into diffusing structure 52. As an example, when the radiation is injected into diffusing structure 52 on an edge of diffusing structure 52, the surface density of patterns 70 increases away from this edge. The variation of the pattern surface density enables to keep a uniformity of the spectral density of the forward radiation flux emitted by emission surface 54 while the spectral density of the radiation flux propagating into diffusing structure 52 decreases away from the area of injection of radiation into diffusing structure 52.

Figure 14:
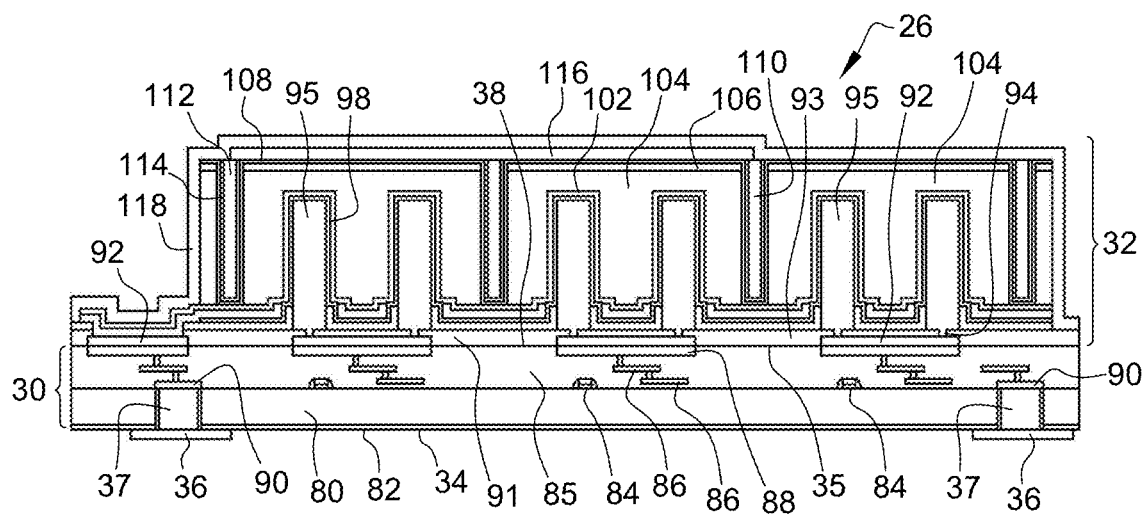
FIG. 14 is a partial simplified cross-section view of a more detailed embodiment of the structure of a display pixel of the group of pixels of FIG. 4.

FIG. 14 is a partial simplified cross-section view of a more detailed embodiment of the group of pixels 26 comprising three display sub-pixels.

According to an embodiment, general control circuit 30 comprises from bottom to top in FIG. 14:
- a semiconductor substrate 80, for example, single-crystal silicon, an insulating layer 82 delimiting lower surface 34 and the conductive pads 36 exposed on lower surface 34;
- transistors 84 of MOS type or of other types conventionally used in integrated circuits, for example, bipolar transistors (BJT, for Bipolar Junction Transistor), formed inside and on top of substrate 80. These transistors may also be thin-film transistors (TFTs) deposited on a substrate of another nature than silicon, for example, a polymer substrate, or even directly deposited on the back side of light-emitting diodes LED. In this case, light-emitting diodes LED form the substrate and the manufacturing method is carried out in the reverse order with respect to what has been previously described, that is, the metallization levels first (stack 85) and the passive and active components last;
- a stack 85 of insulating layers, for example, made of silicon oxide and/or of silicon nitride, covering substrate 80 and the conductive tracks 86 of a plurality of metallization levels formed between the insulating layers of stack 85, having in particular pads 88 exposed on the upper surface 35 of general control circuit 30, where the conductive tracks 86 of the first metallization level may be made of polysilicon and particularly form the gates of MOS transistors 82 and where the conductive tracks 86 of the other metallization levels may be metal tracks, for example, made of aluminum, of silver, of copper, or of zinc; and
- conductive and laterally insulated vias 37, also called TSVs (Through Silicon Vias) crossing substrate 80 and coupling pads 36 to pads 90 of the first metallization level of stack 85.

According to an embodiment, general display circuit 32 comprises from bottom to top in FIG. 14:
- a support 91 forming the lower surface 38 of general display circuit 32 in contact with the upper surface 35 of general control circuit 30 and comprising conductive pads 92 exposed on lower surface 38, in contact with pads 90, and a multilayer insulating structure 93, for example made of silicon oxide or of silicon nitride, extending between pads 92 and covering pads 92 and comprising openings 94 exposing portions of pads 92;
- microwires or nanowires 95, called wires hereafter (six wires being shown), each wire 95 being in contact with one of pads 92 through one of opening 94;
- an insulating layer 96 extending on the lateral sides of a lower portion of each wire 95 and extending on insulating layer 93 between wires 95;
- a shell 98 comprising a stack of semiconductor layers covering an upper portion of each wire 95 and extending on insulating layer 96 between wires 95, shell 98 particularly comprising an active layer which is the layer from which most of the radiation supplied by the light-emitting diode is emitted and comprising, for example, confinement means, such as multiple quantum wells;
- a conductive and reflective layer 100, extending on shell 98 between wires 95;
- a transparent conductive layer 102 forming an electrode covering, for each wire 95, shell 98 and further extending on conductive layer 100 between wires 95;
- photoluminescent blocks 104 covering certain assemblies of light-emitting diodes LED or blocks transparent to the radiation emitted by the light-emitting diodes, each photoluminescent block comprising luminophores adapted, when they are excited by the light emitted by the associated light-emitting diodes LED, to emitting light at a wavelength different from the wavelength of the light emitted by the associated light-emitting diodes LED;
- an insulating layer 106 covering the upper surface of each block 104, which insulating layer 106 may not be present;
- a protection layer 108 covering insulating layers 106, the lateral surfaces of blocks 104, and the electrode layer 102 between blocks 104;
- walls 110 between blocks 104, where each wall 110 may comprise a core 112 surrounded with a coating 114 reflecting at the wavelength of the radiation emitted by photoluminescent blocks 104 and/or light-emitting diodes LED;
- a color filter 116 covering at least some of photoluminescent blocks 104; and
- an encapsulation layer 118 covering the entire structure.

The previously-described separation elements 55 are not shown in FIG. 4 and may surround all the display sub-pixels.

Each wire 95 may have an elongated semiconductor structure. Each wire 95 may have a generally cylindrical shape with a cross-section capable of having different shapes, such as, for example an oval, circular, or polygonal, particularly triangular, rectangular, square or hexagonal, shape. Each wire 95 for example has a mean diameter, for example corresponding to the diameter of the disk having the same area as the cross-section of wire 94, in the range from 5 nm to 5 μm, preferably from 100 nm to 2 μm, more preferably from 200 nm to 1.5 µm, and a height greater than or equal to 1 time, preferably greater than or equal to 3 times, and more preferably still greater than or equal to 5 times the mean diameter, particularly greater than 500 nm, preferably in the range from 1 µm to 50 µm. Wires 95 comprise at least one semiconductor material. The semiconductor material may be silicon, germanium, silicon carbide, a III-V compound, for example, GaN, AlN, InN, InGaN, AlGaN, or AlInGaN, a II-VI compound, or a combination of at least two of these compounds.

Conductive layer 102 is capable of biasing the active layers of shells 98 and of letting through the electromagnetic radiation emitted by the light-emitting diodes. The material forming conductive layer 102 may be a transparent conductive material such as graphene, or silver, or a transparent conductive oxide (TCO), particularly indium tin oxide (ITO), zinc oxide doped or not with aluminum, or with gallium, or with boron. As an example, conductive layer 102 has a thickness in the range from 20 nm to 500 nm, preferably from 20 nm to 100 nm.

Conductive layer 100, conductive tracks 86, and conductive pads 36, 88, 92 may be made of metal, for example, of aluminum, silver, platinum, nickel, copper, gold, or ruthenium, or of an alloy comprising at least two of these compounds, particularly the PdAgNiAu alloy or the PtAgNiAu alloy.

Each of insulating layers 85, 93, 96, 106, 108, 118 is made of a material selected from the group comprising silicon oxide ($SiO_2$), silicon nitride ($Si_xN_y$, where x is approximately equal to 3 and y is approximately equal to 4, for example, $Si_3N_4$), silicon oxynitride (particularly of general formula $SiO_xN_y$, for example, $Si_2ON_2$), hafnium oxide ($HfO_2$), titanium oxide ($TiO_2$), or aluminum oxide ($Al_2O_3$).

According to an embodiment, all the light-emitting diodes of a display pixel Pix emit a light radiation at the same wavelength. The diffusing structure 52 covering this display pixel Pix may then contain luminophores adapted, when they are excited by the light emitted by the display pixel, to emitting light at the desired color. This enables to perform the conversion of the wavelength of the radiation at the level of diffusing structure 52 and not at the level of the display pixel. Thereby, as compared with the structure of the display pixel previously described in relation with FIG. 14, it is possible for photoluminescent blocks 104 and color filters 116 not to be present. Further, the power density received by the luminophores present in diffusing structures 52 is lower than the power density received by the luminophores when they are directly integrated in the display pixels. This is particularly advantageous when the luminophores comprise quantum dots having conversion properties that may degrade over time all the faster as the power density received by these quantum dots is high.

FIGS. 15 to 26 are partial simplified cross-section views of structures obtained at successive steps of an embodiment of the display screen 60 shown in FIG. 7.

Figure 15:
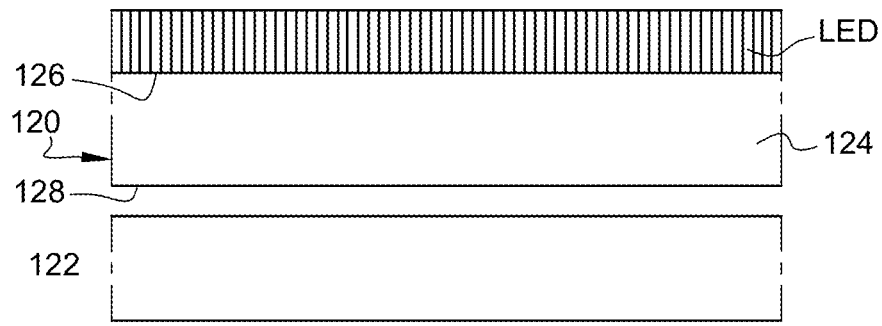
FIG. 15 illustrates a step of an embodiment of a method of manufacturing of a display screen.

FIG. 15 shows the structure obtained after a step of forming of an optoelectronic wafer 120 and a step of forming of a logic wafer 122. Optoelectronic wafer 120 comprises a support 124 having an upper surface 126 and a lower surface 128 and light-emitting diodes LED formed on upper surface 126. Optoelectronic wafer 120 comprises light-emitting diodes LED of the general display circuits of a plurality of groups of pixels. Logic wafer 122 comprises general logic control circuits of a plurality of groups of pixels.

Figure 16:
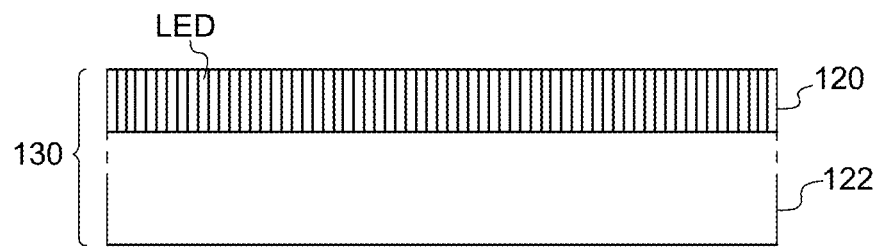
FIG. 16 illustrates another step of the method.

FIG. 16 shows the structure obtained after a step of bonding of optoelectronic wafer 120 to logic wafer 122 on the side of light-emitting diodes LED and the removal of support 124 from optoelectronic wafer 120. The stack 130 of logic wafer 122 and of optoelectronic wafer 122 minus support 124 is called display pixel wafer hereafter.

Figure 17:
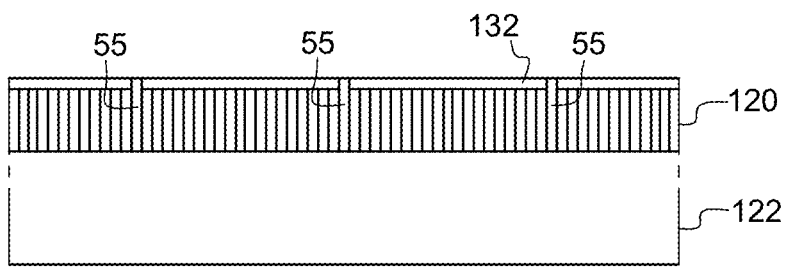
FIG. 17 illustrates another step of the method.

FIG. 17 shows the structure obtained after a step of forming of an optical structure 132 on optoelectronic wafer 120 and the forming of the second separation elements 55 in optical structure 132 and light-emitting diodes LED. Optical structure 132 may have a monolayer structure or a multilayer structure. Second separation elements 55 may comprise opaque and/or reflective walls. Optical structure 132 may comprise the previously-described photoluminescent blocks and color filters. As a variant, it is possible for optical structure 132 not to be present.

Figure 18:
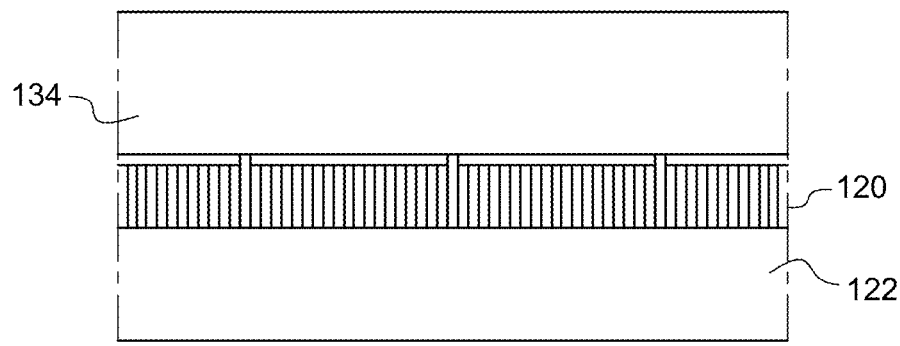
FIG. 18 illustrates another step of the method.

FIG. 18 shows the structure obtained after a step of bonding of display pixel wafer 130 to a handle 134 on the side of optoelectronic wafer 120.

Figure 19:
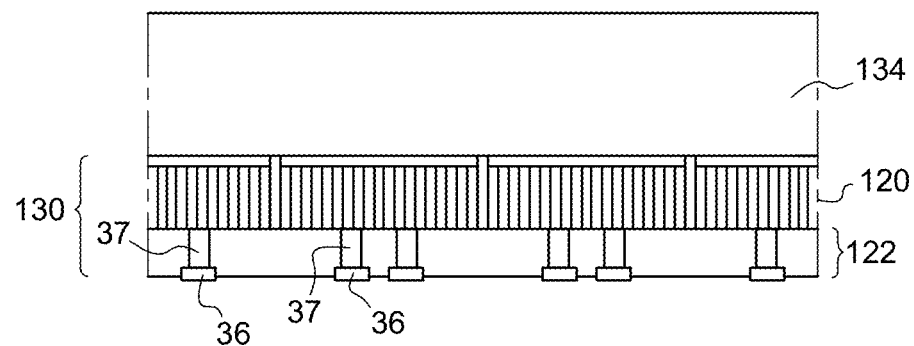
FIG. 19 illustrates another step of the method.

FIG. 19 shows the structure obtained after a step of thinning of logic wafer 122, a step of forming of TSVs 37 through thinned logic wafer 122, and the forming of conductive pads 36, on the lower surface side of display pixel wafer 130, electrically connected to TSVs 37.

Figure 20:
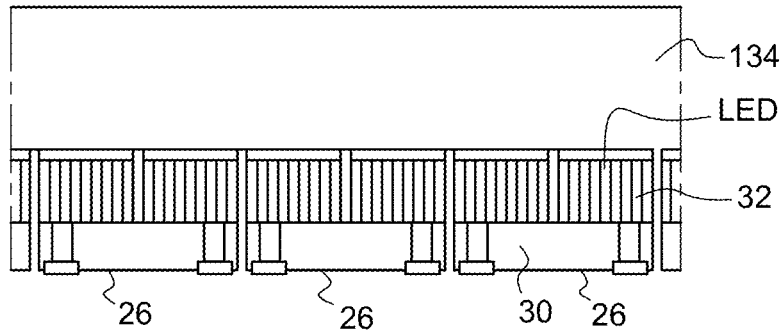
FIG. 20 illustrates another step of the method.

FIG. 20 shows the structure obtained after a step of cutting of display pixel wafer 130 to separate the groups of pixels 26. This step may be performed by sawing. Each group of pixels 26 thus delimited comprises a general display circuit 32 comprising the light-emitting diodes LED of at least two display pixels, preferably of four display pixels, and a general circuit 30 for controlling the light-emitting diodes of the display pixels of the group of pixels 26.

Figure 21:
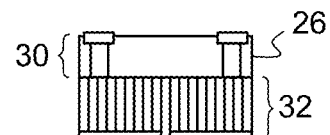
FIG. 21 illustrates another step of the method.
Figure 21:

FIG. 21 shows the structure obtained after a step of transfer of at least one group of pixels 26 from handle 134 to a handle 136, the group of pixels 26 being bonded to handle 136 on the side of general display circuit 32. According to an embodiment, this transfer step may comprise a first transfer of the group of pixels 26 from handle 134 to an intermediate handle, not shown, the group of pixels 26 being attached to the intermediate handle on the side of general control circuit 30 and the transfer of the group of pixels 26 from the intermediate handle to handle 136.

Figure 22:
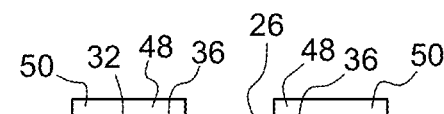
FIG. 22 illustrates another step of the method.
Figure 22:
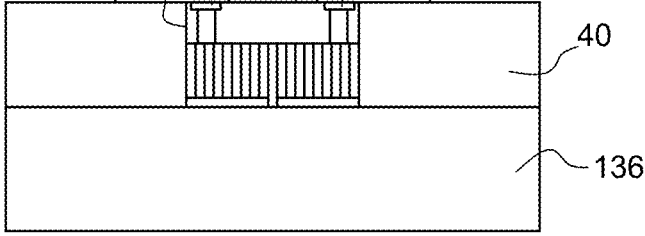

FIG. 22 shows the structure obtained after a step of forming of a dielectric layer on handle 136 and on the display pixel block, a step of planarization to expose the general control circuit 30 of the group of pixels 26 and thus delimit the sheath 40 surrounding the group of pixels 26, and a step of forming of tracks 48 and of contact pads 50, tracks 48 extending on the general control circuit 30 of the group of pixels 26 and on sheath 40, the contact pads 50 resting on sheath 40. The planarization step may comprise a CMP step. Pixel block 28 is then partially formed. For each pixel block 28, the group of pixels 26 of pixel bock 28 comprises the light-emitting diodes associated with a plurality of display pixels which are controlled by the same general control circuit 30. This advantageously enables to decrease the number of conductive pads 36 necessary for the power supply/the control of these display pixels. The decreased number of conductive pads 36 per display pixel and the forming of contact pads 50 enables to increase the interval between contact pads 50. This cases the subsequent laying, described hereafter, of pixel blocks 28 on a slab, by decreasing the constraints relative to the accuracy of the positioning of pixel blocks 28 at the time of the transfer onto the slab.

Figure 23:
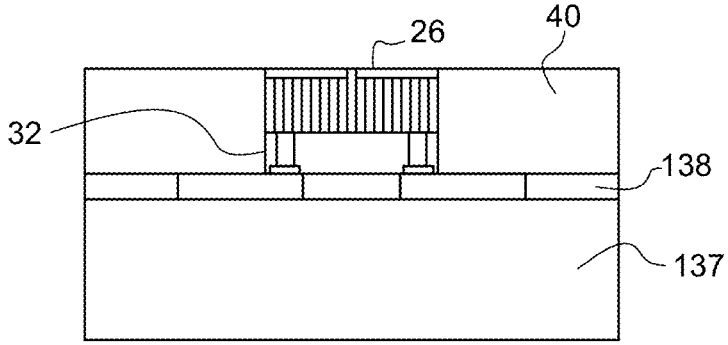
FIG. 23 illustrates another step of the method.

FIG. 23 shows the structure obtained after a step of transfer of the partially-formed pixel block 28 from handle 136 to another handle 137 on the side of the general control circuit 30 of the group of pixels 26, for example via a glue layer 138.

Figure 24:
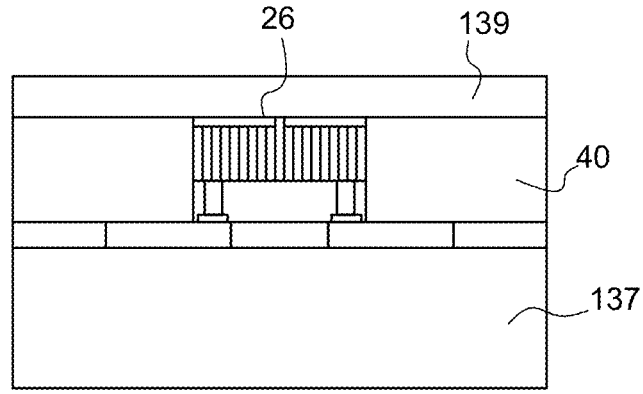
FIG. 24 illustrates another step of the method.

FIG. 24 shows the structure obtained after a step of forming of a diffusing layer 139 on sheath 40 and the group of pixels 26. According to an embodiment, the forming of diffusing layer 139 comprises the forming on the emissive surface of the display pixel block of a layer of a diffusing material. According to an embodiment, the forming of the diffusing layer comprises the forming on the emissive surface of the display pixel block of a layer of a transparent material and the forming of a texturing on the surface of the layer.

Figure 25:
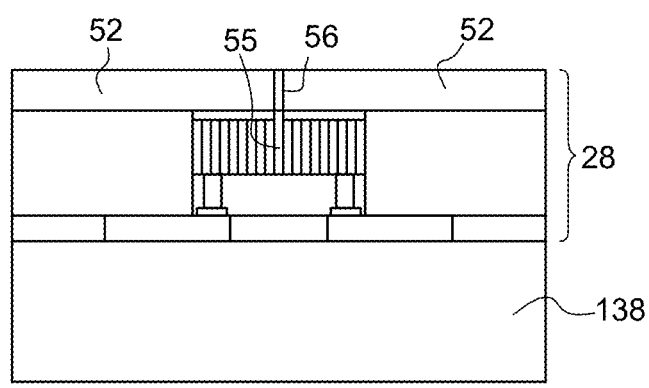
FIG. 25 illustrates another step of the method.

FIG. 25 shows the structure obtained after the forming of second separation elements 56 in diffusing layer 139 to obtain diffusing structures 52. Second separation elements 56 are formed so as to be aligned with the first separation elements 55 of the group of pixels 26, and, when they are present, with the third separation elements present in sheath 40. According to an embodiment, the forming of first separation elements 56 comprises the forming of trenches in diffusing structure 52. According to another embodiment, the forming of second separation elements 56 comprises the forming, in diffusing layer 52, of reflective walls across the entire thickness of diffusing structure 52. The alignment of second separation elements 56 with first separation elements 55 is, advantageously, easier and more accurate to form by the forming of second separation elements 56 in diffusing structure 52 resting on the group of pixels 26 and sheath 40 as compared with the case where it would be obtained by depositing the group of pixels 26, containing first separation elements 55, on diffusing structure 52 containing second separation elements 56. Pixel block 28 is then obtained.

Figure 26:
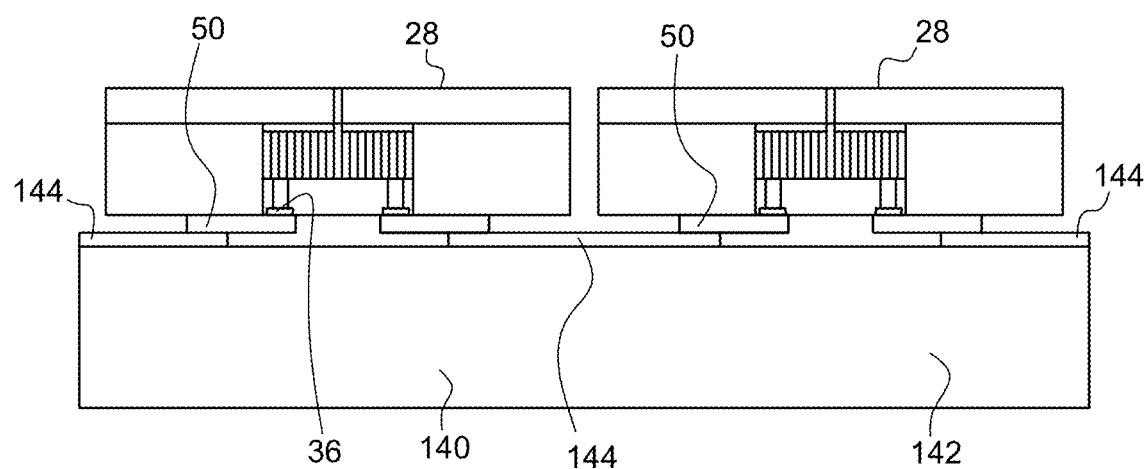
FIG. 26 illustrates another step of the method.

FIG. 26 shows the structure obtained after a step of transfer of pixel blocks 28 onto a display screen slab 140. Slab 140 may comprise a support 142 having conductive tracks 144 extending thereon. Each contact pad 50 of each pixel block 28 is in contact with one of conductive tracks 144. The transfer may be performed by individual pixel blocks 28 or by groups of pixel blocks 28. The enlargement and the respective spacing of contact pads 50 with respect to conductive pads 36 advantageously enables to decrease the accuracy constraints and allows a faster and less expensive positioning of pixel blocks 28 on slab 140.

Figure 27:
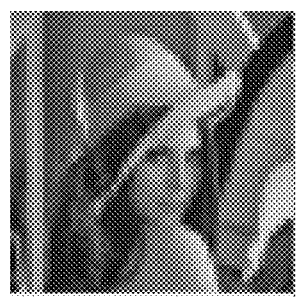
FIG. 27 shows an image displayed by a known display screen.

Tests have been performed comprising the display of the image of FIG. 27 on different display screens. For these tests, the groups of pixels each comprise four display pixels. FIGS. 28, 29, 30, 31, and 32 have been obtained by simulations.

Figure 28:
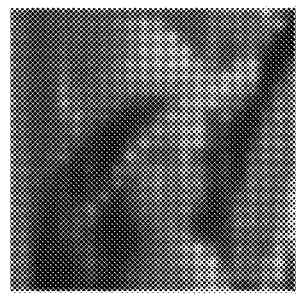
FIG. 28 shows the image displayed by a known display screen with display pixels comprising light-emitting diodes.
Figure 29:
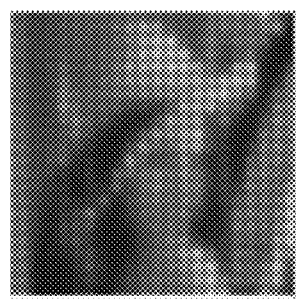
FIG. 29 shows the image displayed by a known display screen with display pixels comprising light-emitting diodes.

FIGS. 28 and 29 each show the image such as it appears to an observer when the display screen has the structure shown in FIG. 2, the surface area occupied by the groups of pixels in top view corresponding to 1% of the surface area of the display screen in FIG. 28 and to 1% of the surface area of the display screen in FIG. 29. The image pixels of the four display pixels of a same group can be uneasily distinguished by an observer.

Figure 30:
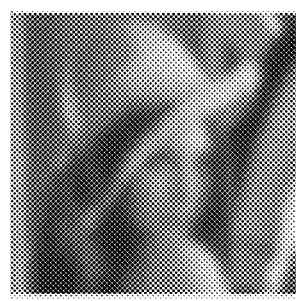
FIG. 30 shows the image displayed on a display screen comprising the groups of pixels of FIG. 4 according to an arrangement of the groups of pixels.
Figure 31:
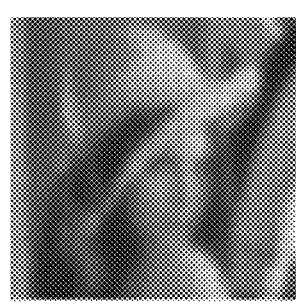
FIG. 31 shows the image displayed on a display screen comprising the groups of pixels of FIG. 4 according to another arrangement of the groups of pixels.
Figure 32:
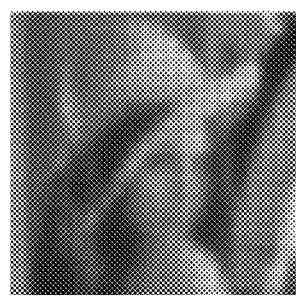
FIG. 32 shows the image displayed on a display screen comprising the groups of pixels of FIG. 4 according to another arrangement of the groups of pixels.

FIGS. 30, 31, and 32 each show the image such as it appears to an observer when the display screen has the structure shown in FIG. 7, the surface area occupied by the pixel blocks in top view corresponding to 100% of the surface area of the display screen in FIGS. 30, to 80% of the surface area of the display screen in FIG. 31, and to 64% of the surface area of the display screen in FIG. 32. The image pixels of the four display pixels of a same group can be distinguished by an observer.

Various embodiments and variants have been described. Those skilled in the art will understand that certain features of these various embodiments and variants may be combined, and other variants will occur to those skilled in the art. In particular, in the previously-described embodiments, the group of pixels 26 of pixel block 28 comprises a plurality of display pixels Pix. It should however be clear that the group of pixels 26 may correspond to an optoelectronic circuit comprising a single display pixel. Further, in the previously-described embodiments, pixel block 28 comprises diffusing structures 52. It should however be clear that it is possible for diffusing structures 52 not to be present. Further, the diffusing structure may comprise a portion forming a waveguide such as shown in FIGS. 10 to 13 and a portion made of a diffusing material. Further, although in the previously-described embodiments, the group of pixels 26 comprises two chips bonded to each other, it should be clear that the group of pixels may comprise a single chip, the electronic light-emitting diode control circuit being formed in integrated fashion with the light-emitting diodes or not being integrated to the group of pixels. Finally, the practical implementation of the described embodiments and variations is within the abilities of those skilled in the art based on the functional indications given hereabove.

The invention claimed is:

1. Display block comprising:
an optoelectronic circuit comprising light-emitting diodes of at least two display pixels and having a first surface of emission of the light radiations of the light-emitting diodes; and
diffusing structures covering the optoelectronic circuit, each diffusing structure being in contact with a respective portion of the first emission surface associated with a respective display pixel among the display pixels and having a second surface of emission of the light radiations of the light-emitting diodes of said respective display pixel, the ratio of the sum of the areas of the second emission surfaces to the area of the first emission surface being greater than 2, wherein said respective portion of the first emission surface is not centered with respect to the second emission surface, and wherein the display pixels of the optoelectronic circuit are contiguous and wherein the first emission surface is centered with respect to the surface formed by the second emission surfaces.

2. Display block according to claim 1, wherein the display pixels are separated by first separation elements which do not let through the light radiations of the light-emitting diodes and wherein the diffusing structures are separated by second separation elements which do not let through the light radiations of the light-emitting diodes, the first separation elements being aligned with the second separation elements at the level of the first emission surface.

3. Display block according to claim 1, wherein each second emission surface is a diffusing surface.

4. Display block according to claim 1, wherein each diffusing structure is at least partly made of a diffusing material.

5. Display block according to claim 1, wherein each diffusing structure is at least partly formed of a waveguide.

6. Display block according to claim 1, wherein each diffusing structure comprises patterns distributed on a surface and reflecting or diffusing the light radiations.

7. Display block according to claim 6, wherein the surface density of the patterns increases away from the optoelectronic circuit.

8. Display block according to claim 1, comprising an electrically-insulating sheath surrounding the optoelectronic circuit, the diffusing structures covering the sheath, in contact with the sheath or separated from the sheath by an air film via spacers interposed between the sheath and the diffusing structures.

9. Display block according to claim 8, wherein the optoelectronic circuit comprises a third surface opposite to the first surface and first electrically-conductive pads exposed on the third surface, the display block comprising electrically-conductive tracks in contact with the first electrically-conductive pads and continued by second electrically-conductive pads extending on the sheath.

10. Display block according to claim 1, wherein each diffusing structure only receives the light radiation of the light-emitting diodes of one of the display pixels.

11. Display block according to claim 1, wherein at least one of the diffusing structures contains luminophores.

12. Display block according to claim 11, wherein the luminophores comprise quantum dots.

13. Display block according to claim 11, wherein at least two diffusing structures contain different luminophores.

14. Display block according to claim 11, wherein the light-emitting diodes each emit a first light radiation at a first wavelength, and wherein the diffusing structures comprise a first diffusing structure comprising first luminophores adapted to converting the first light radiation into a second light radiation at a second wavelength different form the first wavelength and a second diffusing structure comprising second luminophores adapted to converting the first light radiation into a third light radiation at a third wavelength different from the first wavelength and from the second wavelength.

15. Display block according to claim 1, wherein the optoelectronic circuit comprises four display pixels.

16. Display block according to claim 1, wherein the optoelectronic circuit comprises a single circuit for controlling all the light-emitting diodes of the display pixels.

17. Display screen comprising a slab and a plurality of display blocks according to claim 1 bonded to the slab.

18. Display screen according to claim 17, wherein the display pixels of the display blocks are arranged in rows and in columns, and wherein the optoelectronic circuit of each display block comprises at least four display pixels belonging to at least two adjacent rows and to at least two adjacent columns.

19. Method of manufacturing display blocks according to claim 1, comprising the following steps:
   a) forming of a wafer comprising a plurality of said optoelectronic circuits;
   b) cutting of the wafer to separate said optoelectronic circuits; and
   c) for each separate optoelectronic circuit, forming of the diffusing structures covering the optoelectronic circuit.

20. Method according to claim 18, further comprising, at step a), the forming of first separation elements in each optoelectronic circuit separating the display pixels, and, at step c), the forming of second separation elements separating the diffusing structures and aligned with the first separation elements.

21. Method of manufacturing a display screen according to claim 17, comprising the installing of the display blocks on the slab.

* * * * *